United States Patent [19]

Iversen

[11] Patent Number: 5,001,548
[45] Date of Patent: Mar. 19, 1991

[54] MULTI-CHIP MODULE COOLING

[75] Inventor: Arthur H. Iversen, Saratoga, Calif.

[73] Assignee: Coriolis Corporation, Saratoga, Calif.

[21] Appl. No.: 441,989

[22] Filed: Nov. 28, 1989

Related U.S. Application Data

[63] Continuation-in-part of Ser. No. 322,422, Mar. 13, 1989, abandoned, which is a continuation-in-part of Ser. No. 391,139, May 22, 1989.

[51] Int. Cl.⁵ .................. H01L 25/04; H02B 1/20; H02B 1/00; H05K 7/20
[52] U.S. Cl. ...................... 357/82; 361/381; 361/383; 165/80.3; 357/81
[58] Field of Search ............. 357/82, 81; 174/15.1, 174/16.1; 361/381, 382, 383, 385; 165/80.3

[56] References Cited

U.S. PATENT DOCUMENTS 4,712,158 12/1957 Kikachi et al. ............... 361/385
4,712,609 12/1987 Iversen ...................... 165/80.4
4,799,543 1/1989 Iversen ...................... 165/135

FOREIGN PATENT DOCUMENTS 197709 9/1977 U.S.S.R. ...................... 361/352
2033668 5/1980 United Kingdom ........... 361/382

Primary Examiner—Andrew J. James
Assistant Examiner—Stephen D. Meier
Attorney, Agent, or Firm—Foley & Lardner

[57] ABSTRACT

There is disclosed a liquid cooled multi-chip semi-conductor module comprising multiple semi-conductor devices each having one surface prepared with electrical interconnect means for mechanical and electrical attachment to an electrical interconnect substrate, said semi-conductor device having a surface opposing said surface prepared with said electrical interconnect means, said opposing surface being a heat transfer surface having a low thermal resistance whereby heat generated in said semi-conductor device may be readily transported through said opposing heat transfer surface to a liquid coolant, there further being a conduit for the directing of the flow of said coolant, one surface of said conduit having apertures corresponding in placement and geometry to said heat transfer surfaces of said semi-conductor devices mounted on said electrical interconnect means wherein said heat transfer surfaces and said conduit surface containing said apertures are approximately coincident thereby providing an approximately hydraulically smooth surface for the flow of coolant thereby minimizing undesirable flow characteristics such as cavitation and vortex shedding.

30 Claims, 9 Drawing Sheets

MULTI-CHIP MODULE COOLING

This is a continuation-in-part of application Ser. No. 07/322,422, filed Mar. 13, 1989, abandoned which is a continuation-in-part of application Ser. No. 07/391,139, filed May 22, 1989.

TECHNICAL FIELD

The present invention relates to boiling heat transfer and particularly concerns means for the efficient cooling of semi-conductor devices.

BACKGROUND OF THE INVENTION

The need for more efficient heat removal from semi-conductor devices has become more important as design rules for IC's shrink and power levels of devices increase. Bipolar and power MOS FET devices are high in power consumption, and thus as rule size decreases to increase device density and speed, heat flux increases. The need exists for semi-conductor heat removal structures that can handle higher heat fluxes, are more compact and less costly.

SUMMARY OF THE INVENTION

The present invention provides for the efficient cooling of high power semi-conductor devices.

The present invention provides for the efficient cooling of high power semi-conductor devices mounted on an interconnect substrate.

The present invention provides for the efficient cooling of high power semi-conductor devices mounted on an interconnect substrate and which are sealed in a liquid tight enclosure.

The present invention provides for the efficient cooling of high power semi-conductor devices mounted on interconnect substrate and which are sealed in a liquid tight enclosure that is removable and may readily be replaced.

The present invention provides for a reduction in the failure rate of devices due to thermal cycling.

DESCRIPTION OF THE PREFERRED EMBODIMENT

Figure 1:
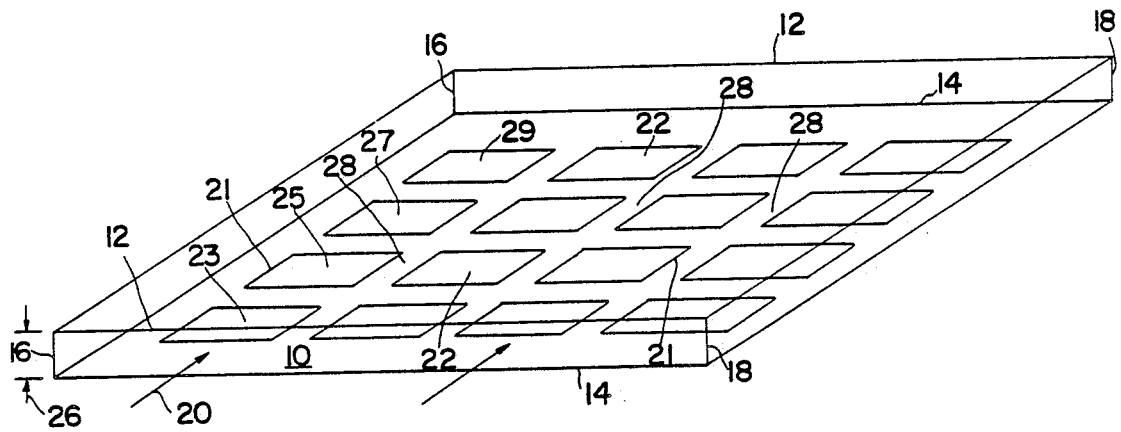
FIG. 1 is an angled view of a semi-conductor device cooling conduit illustrating semi-conductor heat exchange surfaces exposed to the flow of coolant.

Referring now to FIG. 1, shown is a fluid conduit 10 comprising upper surface 12, lower surface 14 and walls 16, 18 through which a coolant 20 flows. Lower surface 14 is provided with one or more openings 21 into which are fitted the heat exchange surface 22 of semi-conductor devices. Surfaces 22 are substantially co-planer with lower surface 14. The geometry of openings 21 are substantially the same as the geometry of heat exchange surfaces 22 so as to create a substantially continuous surface 14 that is as hydraulically smooth as practical. That is, undesirable coolant flow characteristics such as cavitation and vortex shedding are minimized. Under these circumstances, heat exchange is by linear flow within conduit 10 where by subcooled nucleate boiling the heat flux $q \sim v^{\frac{1}{2}}$ where v is the coolant velocity. Conduit 10 therefore is a conventional linear flow heat exchanger. The height 26 of conduit 10 is determined by the required cross-section of conduit 10 which in turn is dictated by the volume flow requirement needed to keep the discharge coolant below its boiling point and the coolant velocity needed for the highest chip heat flux in order to remain below the critical heat flux, i.e. burn out. In addition, higher coolant velocities may be required to minimize temperature overshoot. In general, height 26 is small and ranges from about $\frac{1}{8}$ mm to 5 mm. Conduit height 26 provides design flexibility in obtaining required heat flux removal while optimizing fluid flow, required fluid volume and secondary heat exchanger parameters.

As seen in FIG. 1 coolant flow is across the entire width of surface 14. Coolant flow over surfaces 28 between the heat exchange surfaces 22 of columns of semi-conductors, e.g. the column comprising devices 23, 25, 27 and 29 heat exchange surfaces 22, serves no useful purpose inasmuch that there is no heat to be dissipated in that region. Thus, there is inefficient use of the coolant flow that is wasteful of pump power. In addition, it is increasingly difficult to control the flow characteristics of coolant 20 as the conduit width 14 increases.

Figure 2:
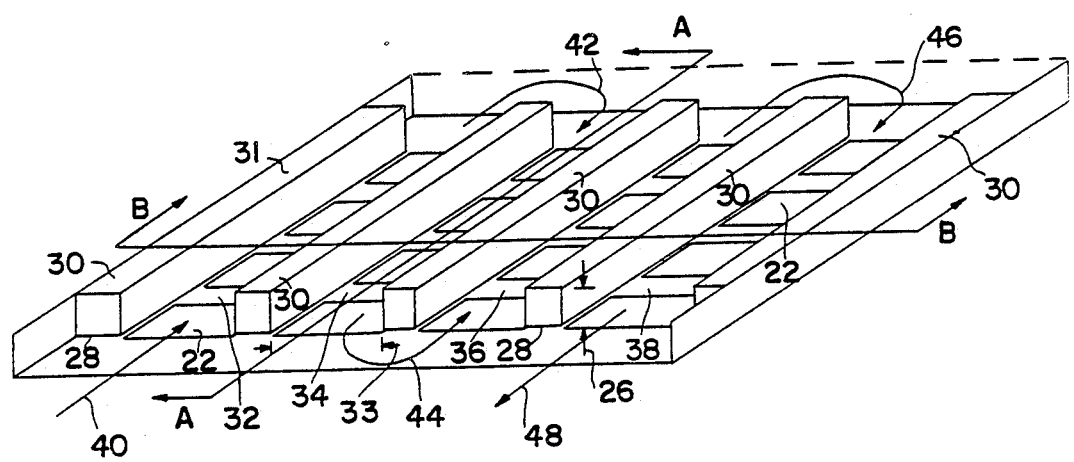
FIG. 2 is an angled view of the semi-conductor device cooling conduit of FIG. 1 illustrating partitions between the columns of semi-conductor heat exchange surfaces.

A solution to the foregoing is to be found in FIG. 2. Regions 28 between semi-conductor heat exchange surfaces 22 are provided with partitions 30, said partitions extending from lower surface 14 to upper surface 12 of conduit 10 thereby effectively isolating the flow of coolant between adjacent columns of semi-conductor heat exchange surfaces 22. In this manner coolant conduit 10 is divided into conduits 32, 34, 36 and 38. This not only makes more efficient use of coolant, but the walls of partitions 30 serve to confine and direct the flow of coolant over heat exchange surfaces 22 in a more controlled manner. The spacing 33 between adjacent partitions 30 may be larger than the width of heat exchange surface 22 to insure that coolant flow wall effects do not affect heat transfer at the device heat exchange surface 22. A further advantage of partitions 30 is that flow in channels 32, 34, 36 and 38 can be established in series. This has special merit if higher coolant velocities are needed for devices dissipating high heat fluxes or if needed to suppress temperature overshoot. The designation conduit 10 is hereinafter used collectively or individually refer to conduits 32, 34, 36 and 38.

Entering coolant flow 20 flows through conduit 32 and in a smooth curved manner makes a 180° turn 42 into conduit 34. The coolant makes the same smooth 180° turn 44 from conduit 34 to 36 and likewise 46 from conduit 36 to 38 and thence discharges 48 to an external heat exchange system whence it is again recirculated. Any combination of series-parallel flow may be employed to best advantage, for example, conduits 32 and 34 may be seriesed as would conduits 36 and 38 thus providing dual seriesed flow. Partitions 30 between conduits 32, 34, 36 and 38 need not provide a hermetic seal. The seal between partitions 30 and surfaces 12 and 14 need only be sufficiently liquid tight so as to restrict leakage between conduits to within acceptable limits.

Figure 3:
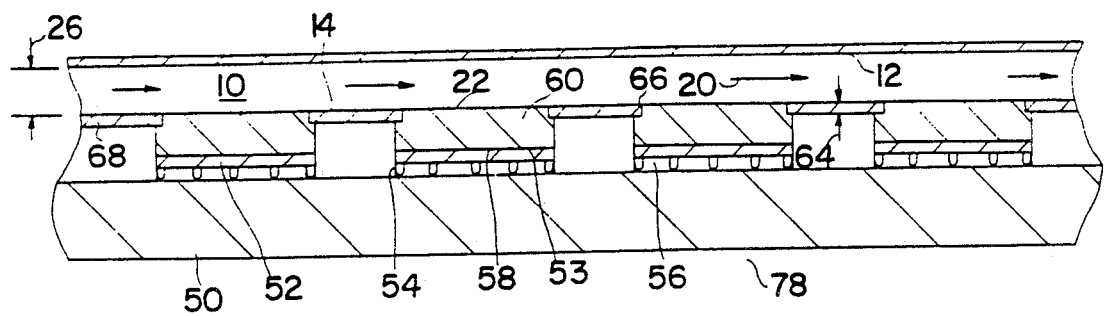
FIG. 3 is a cross section view A—A of FIG. 2 along a column of semi-conductors illustrating the cooperating construction of the coolant conduit and semi-conductor devices mounted on a circuit board.

FIG. 3 illustrates an interconnect substrate 50 which may include but is not limited to a printed wiring board, e.g. epoxy glass, thick-film multilayer hybrid on ceramic, ceramic multilayer hybrid or thin film multilayer hybrid on various substrates, hereinafter referred to as the wiring board or board. Semi-conductor chips 52 are mounted on board 50 by various techniques such as flipchip or Tape Automated Bonding (TAB). Semi-conductor chips 52 are joined physically and electrically to board 50 by means 54 such as solder bumps or tabs. Other surface mounting techniques may also be employed. If one or more of boards 50, with chips 52 or devices 53 mounted thereon, are mechanically and electrically mounted on a mother board, board 50 may be also be designated a multi-chip module or module.

In FIG. 3 semi-conductor chips 52 are shown bonded to board 50 by solder bumps 54 for illustration purposes. The surface 56 of semi-conductor 52 containing the electrical interconnects 54 generally faces board 50 upon which the electrical interconnects are made. The opposing surface 58 of semi-conductor 52 is designated as the heat transfer surface. The opposing surface 58 of chip 52 has bonded, in a thermally intimate manner, a low thermal resistance member 60 whose characteristic is that the bulk of the heat generated in chip 52 is conveyed through low thermal resistance member 60 to heat exchange surface 22 which in turn is cooled by liquid coolant flow 20. A complete semi-conductor device 53 may comprise chip 52, member 60, and electrical interconnect means 54 and such other packaging components, e.g. encapsulant, as may be needed, or it may be a bare chip device comprising chip 52, interconnect means 54 and other needed components. Bare chip is herein defined as a semi-conductor chip 52 whose one surface contains elements such as transistors, diodes etc. and to which is connected electrical interconnect means such as solder bumps 54, TAB, wire bond leads, etc., and whose opposing surface 58 is the heat exchange surface 22 that is directly cooled by a flowing coolant 20. In general, semi-conductor chips are made from silicon or gallium Arsenide, but may also be made from other suitable materials. Included are chips such as Integrated Circuits (IC's), solid state lasers, power devices, e.g. MOSFETS, etc. Heat exchange from surface 22 to coolant 20 may be by conduction or nucleate boiling depending upon the heat flux to be dissipated. In general, member 60 is thin and has high thermal conductivity. By virtue of efficient cooling from flowing coolant, member 60 and chip 52 may be about the same size and geometry thereby permitting high packaging densities with high power devices on board 50, the density being substantially independent of heat removal requirements. Low thermal resistance member 60 may be joined to chip 52, preferably over the entire area of contact 58, by soft solder, e.g. PbSn, brazed with a gold eutectic alloy, jointed with a silver-glass composition or other means that provides low thermal resistance between chip 58 and member 60. For lower power devices, member 60 may be made of a thin, e.g. 0.05 mm to 3 mm thickness piece of alloy 42 or kovar. The expansion match to silicon is good. It is inexpensive and at moderate heat fluxes and in thin sections its relatively poor thermal conductivity provides an acceptable thermal resistance. At higher heat fluxes, metals such as molybdenum or tungsten are preferred, with tungsten having a very low differential expansion compared to silicon and a high thermal conductivity. However, tungsten costs about 4× more than molybdenum. Member 60 may also be of ceramics such as silicon carbide, silicon nitride or aluminum nitride which have high thermal conductivities and good to excellent coefficient of expansion matches to silicon. Ceramic thickness ranging from 0.05 mm to 5 mm may be used. Other ceramics, through not as good, from a thermal conductivity and/or expansion match viewpoint, may be used, e.g. Alumina and Beryllia. Various established means to bond ceramics to chips 52 may be employed. Brazing ceramics to chips 52 may require metalizing the ceramic.

The criteria for the selection of member 60 is that its thermal resistivity should be such that the maximum permissible junction temperature is not exceeded at the highest heat flux. With subcooled nucleate boiling and a given heat flux, the same semi-conductor device will have approximately the same junction temperature throughout the system from board to board, cabinet to cabinet and room to room, independent of location or environment. This is important for devices with temperature sensitive threshold shifts, e.g. ECL and for other devices with temperature sensitive operating characteristics. In addition, with junction to fluid thermal resistances $O_{jf}$ of ~0.1° C./Wcm², junction temperature variations between moderate and high power devices is kept to a minimum. In the nucleate boiling mode, the heat exchange surfaces 22 are maintained at the boiling temperature of the coolant, e.g. 56° C. for FC72 or 32° C. for FC87 plus a few degrees of superheat. For example, with a thermal resistance of ~0.1° C./Wcm² and assuming one device dissipates 40W and a second device dissipates 15W and using FC72, the junction temperature of the first device will be ~60° C. plus a few degrees superheat and the junction temperature of the second device will be ~57.5° C. plus a slightly lesser superheat. Thus, devices with widely divergent power dissipations can be made to operate over a narrow range of junction temperatures.

The selection of a metal such as alloy 42, molybdenum or tungsten versus a ceramic such as silicon carbide, silicon nitride or aluminum nitride for heat transfer member 60 may be dictated by such factors as cost or whether a conductor, i.e. metal or ceramic, i.e. insulator is most desirable. Member 60 may also be made of silicon, which is essentially a perfect expansion match to silicon chip 52 and has good thermal conductivity. A further option is not to use member 60 and simply directly liquid cool the exposed surface 58 of chip 52. This is, surface 58 of chips 52 becomes heat exchange surface 22. This provides the lowest possible junction to fluid thermal resistance. $O_{jf}$~0.02° C./Wcm² opposing only of the chip 52 itself. FIGS. 11, 12, 13, 14 and 18 illustrate construction for bare chip cooling. However, the necessary mechanical support for handling and mounting of chip 52 must then be supplied by other means such as the electrical interconnect means 54, e.g. as used in TAB.

Again referring to FIG. 3, lower conduit 10 surface 14 is shown as being substantially co-planar with heat exchange surfaces 22 of members 60. Upper conduit 10 surface 12 is displaced by conduit height 26. Coolant flow 20 removes heat from member surface 22 by conduction for low power devices and by subcooled nucleate boiling for high power devices. Specifying conduit height 26, e.g. ⅛ mm to 5 mm, enables optimum heat transfer characteristics to be obtained by virtue of optimized coolant flow parameters. Requirements such as suppression of temperature overshoot may require appreciable coolant velocities e.g. 400-600 cm/sec, and correspondingly small conduit heights 26 to minimize volumetric flow requirements.

Lower surface 14 may be provided by a sheet of material 68 of thickness 64 which is provided with cutouts corresponding in geometry and position to members 60. Members 60 may be provided with a peripheral notch 66 for sheet material 68 to fit into thereby providing alignment of surface 14 of sheet 68 with heat exchange surface 22 of member 60 in an approximately smooth and continuous manner. Smooth transitions of surface 14 to surface 22 minimizes undesirable flow characteristics such as cavitation, vortex shedding etc. and provides a substantially hydraulically smooth surface for the flow of coolant 20 in conduit 10.

Sheet 68 may be a non-conductor such as plastic or ceramic or it may be a conductor such as metal. In general, it is desirable to electrically isolate devices 53. Thus, when sheet 68 material is a non-conductor such as plastic, heat dissipating member 60 may be a metal, e.g. tungsten, molybdenum, alloy 42 etc. or ceramic, e.g. Silicon Carbide, Alumina etc. When sheet 68 material is a metal, member 60 is preferably a non-conductor such as a ceramic, e.g. Silicon Carbide, Alumina, Beryllia. When the junctions of sheet 68 and member 60 are electrically insulated from each other, sheet 68 and member 60 may both be a conductor.

With normal manufacturing tolerances, some devices 53 (FIG. 4) will be tilted and some will be higher than adjacent assemblies. To accommodate these geometric variations, sheet 68 should be sufficiently flexible to fit into peripheral notch 66 of member 60 or provided with other means to align surfaces 14 and 22 thereby maintaining continuity of surface 14. The manufacturing tolerances causing tilt and height variations in surface 22 will, in general, be small, usually less than a millimeter. To fit sheet 68 into notches 66 a flexible platen 70 presses sheet 68 into position on member 60, the flexibility of platen 70 enables said platen to distort to accommodate the small variations in the height and tilt of members 60. Platen 70 is sufficiently stiff that it does not cause any appreciable bowing of surface 14 between reference surfaces 22. Platen 70 may be designed to fit between partitions 30. The space 72 between sheet 68 and board 50 may then be impregnated with a suitable filler material 74, e.g. foam, epoxy etc. which is then cured to firmly anchor sheet 68 in place. Surface 14 and filler 74 is designated lower conduit structure 75. This provides a smooth albeit slightly undulating surface 14 the degree of undulation being determined by variations in height and tilt of surfaces 22, i.e. the manufacturing tolerances. The nature of filler material 74 and sheet 68 is such that it may be subsequently removed, e.g. chemically and/or mechanically, for repairs and replacement of devices 53. Impregnated space 72 may contain channels, e.g. for pressure equalization, low level coolant flow, etc. To facilitate removal of 74, board 50 surface 51 may be prepared with a low level release agent.

An alternative method to provide lower conduit structure 75 is not to use sheet 68 but rather, with platen 70 in place to form a reference surface while pressing 84 against surfaces 22 of members 60 space 72 is filled with a material 74, e.g. silicone, epoxy etc. that is cured in place. This has the advantage that notch 66 is not required, and the flow of filler material 74 will fill all voids and provide a very smooth and continuous surface. This construction has the advantage in that the material 74 and devices 53 may now be in a sealing relationship and thereby isolate conduits 10 from board 50 in a liquid tight manner. This can enable construction to provide for the board 50 to be external to the coolant loop. It should be noted that since virtually all the heat from chip 52 is dissipated through member 60, the thermal insulating properties of material 74 will have minimal affect on semi-conductor operation and life. Board 50 surface 76 directly under chip 53 may be treated in such a manner that material 74 does not flow, e.g. does not wet, onto surface 76 thereby facilitating repairs.

Figure 4:
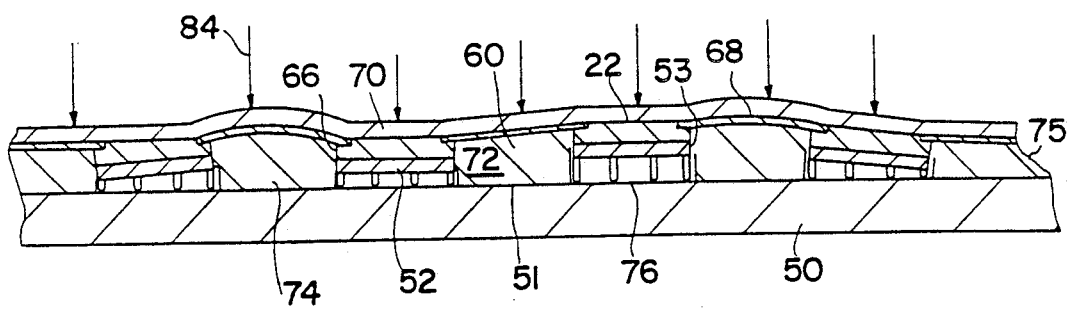
FIG. 4 is a cross section view of A—A of FIG. 2 illustrating a pressure method for mating the semi-conductor heat exchange surfaces with its corresponding conduit surface.

A further alternative, that may be employed with sufficiently precise manufacturing tolerances of semiconductor assemblies 53 and their placement on board 50, is to prefabricate lower conduit structure 75 then to snugly fit said structure 75 onto board 50 over devices 53 such that conduit surface 14 and heat exchange surface 22 are as hydraulically smooth as possible, e.g. close fitting and planar as possible (FIG. 4).

Figure 6:
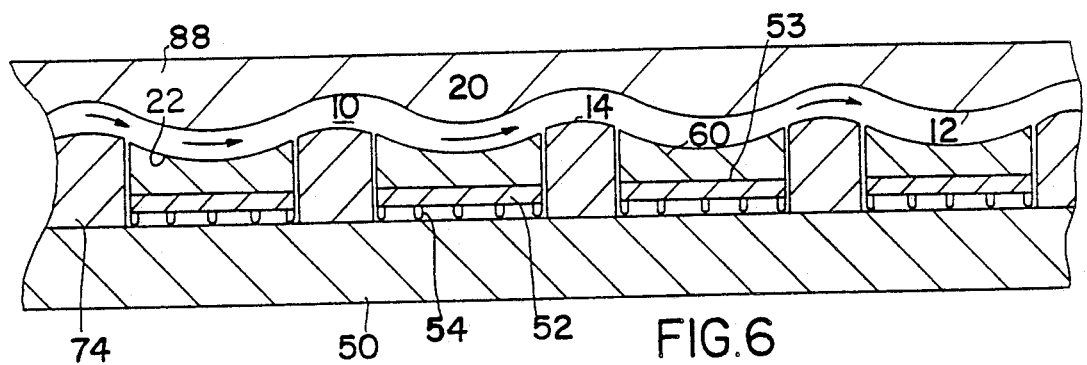
FIG. 6 is a cross section view of an undulating coolant conduit illustrating construction of a conduit assembly incorporating curved surface cooling.

To provide for conduit height 26, partitions 30 (FIG. 2) of height 26, e.g. ⅛ mm to 5 mm, may be employed as previously described. If surface 14 is planar, partitions 30 may be rigid. If surface 14, e.g. FIG. 6, is undulating, partitions 30 may be flexible, e.g. uncured thermoplastic, and when contoured to undulating surface 14 partitions 30 are cured, e.g. hardened, thereby providing a fixed conduit height 26 above surface 14. Upper conduit surface 12 may be a suitable thermoplastic it being installed with partitions 30 and curved simultaneously with partitions 30. In another embodiment upper conduit surface 12 may be a metal sheet in which case it is affixed to the upper surface 31 of partitions 30 (FIG. 2) by adhesives, screws etc. after hardening of partitions 30. A further embodiment is to employ the inner surface of can 96 (FIG. 7) as the upper surface 12 of conduit 10.

Partitions 30 are seen to serve two desirable functions, one being to divide conduit 10 of FIG. 1 into multiple conduits, e.g. 32, 34, 36 and 38, of FIG. 2, and second to provide multiple support members for maintaining constant conduit height 26 an for stiffening upper conduit surface 12.

Figure 5:
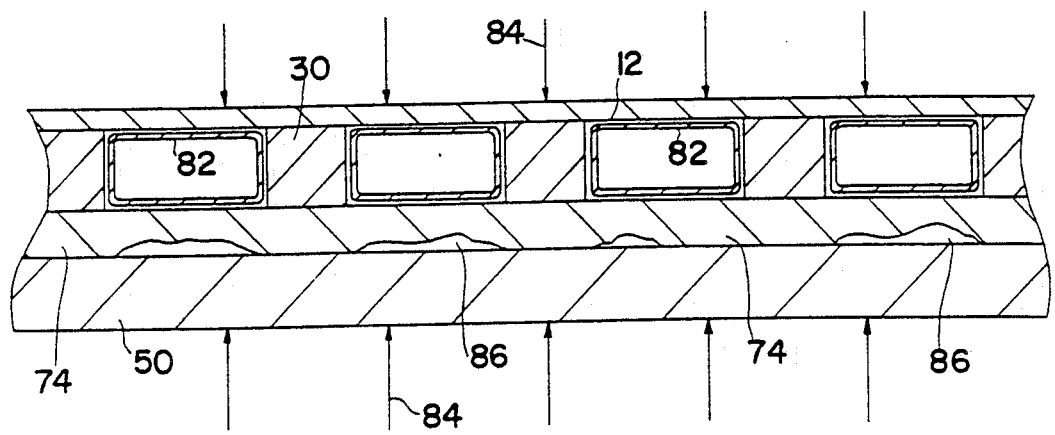
FIG. 5 is a cross section view B—B of FIG. 2 illustrating a pressure method to insure proper positioning of the lower conduit members with respect to the circuit board.

A further and most economical embodiment is to prefabricate the entire conduit assembly, comprising lower surface 14 and filler 74, partitions 30 and upper surface 12 into a single unit as unitized conduit assembly, e.g. from separate pieces or mold as a single structure, and then to "snap" it into place over board 50 containing semi-conductor assemblies 53 (FIGS. 3 and 4). Adhesives may be used to bond the unitized conduit assembly to surface 51 of board 50. To insure surface 14 and surface 22 are substantially co-planar, a pneumatic, hydraulic or otherwise expandable member 82 is inserted into conduits 10 or 32, 34, 36 or 38 shown in FIG. 5. Surface 12 and board 50 are clamped 84 on opposing surfaces to provide rigid support. Expandable members 82 are served from a common pressure source and thereby exert equal pressures. Clamping action 84 on both sides, i.e. against surface 12 and board 50, permits movement only of filler material 74 into gaps 86 by expansion of member 82. In this manner surface 14 and heat exchange surface 22 are brought into proper alignment.

To improve the efficiency of cooling of heat exchange surface 22, curved surface cooling may be employed as shown in FIG. 6. Subcooled nucleate boiling heat transfer at high heat fluxes is inherently more efficient from a curved surface, where the heat flux removed $q \sim v$ where v is the coolant velocity, as compared to a liner surface cooling where the flux removed $q \sim (v)^{\frac{1}{2}}$. In curved surface cooling the centrifugal force generated by coolant flow over concave curved heat exchange surfaces provides significant and beneficial buoyancy forces which enhance heat transfer. Heat exchange surface 22 of member 60 is shown as concave curved with respect to coolant flow. Surfaces 14 intermediate between devices 53 containing surfaces 22 in the direction of coolant flow are convex curved with respect to coolant flow. Curved surfaces 22 and 14 of FIG. 6 in the direction at right angles to coolant flow are extended so as to have the approximate form, for example, of cylindrical surfaces across the width of conduit 10 or between partitions 30. Curved surfaces 22 and 14 may be curved in shapes other than cylindrical. In general, curved surfaces 22 and 14 extend linearly in the direction orthogonal to coolant flow 20. Thus, conduit 10 to FIG. 6 follows an undulating path in the direction of coolant flow.

Inasmuch as only curved heat exchange surface 22 is heated, and convex curved conduit surface 14 is not a source of heat, the essentially negative heat transfer characteristics of convex surface 14 is of no consequence. The construction of conduit assembly 73 in FIG. 6 comprising upper surface 12, conduit 10, lower surface 14 and filler 74 is much the same as for the planar conduit assembly of FIGS. 3, 4 and 5 except for curved surfaces instead of linear surfaces.

Figure 7:
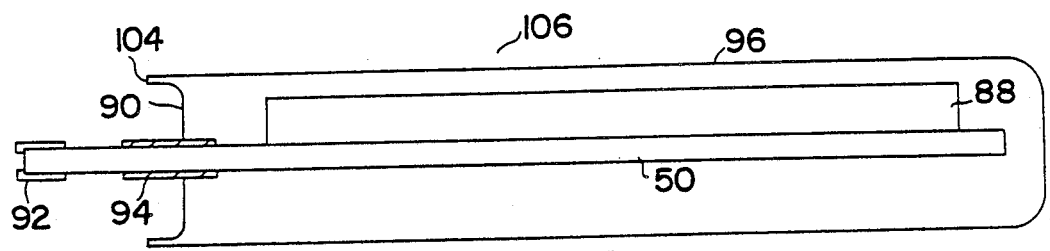
FIG. 7 is a cross section view of a liquid coolant conduit assembly and circuit board housed within a liquid tight enclosure.
Figure 8:
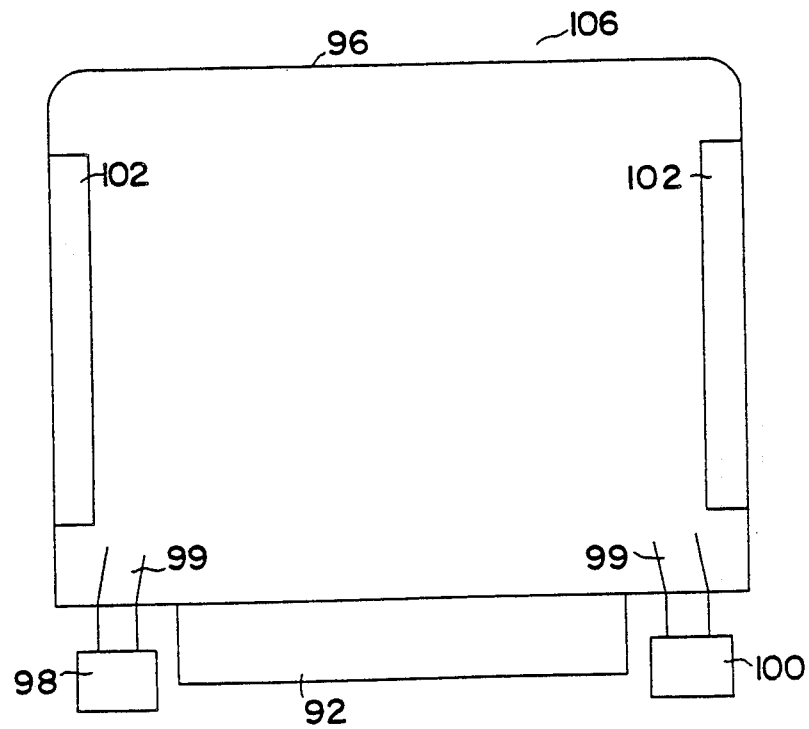
FIG. 8 is a front view of FIG. 7.

Packaging 106 of conduit assembly 73, interconnect substrate 50 and mounted semi-conductor assemblies 53 is shown schematically in FIGS. 7 and 8. Referring now to FIG. 7, flange 90 is mounted on board 50 between electrical connector 92 and conduit assembly 73. Metal sleeve 94 whose inside surface is fitted to board 10 and hermetically bonded thereto, is first hermetically bonded, e.g. soldered, brazed, welded etc. to flange 90 thereby forming a sturdy attachment. To further enhance the mechanical attachment of sleeve 94 or flange 90 to board 50, mechanical means such as rivets, screws etc. may also be employed. Coolant connectors, input 98 and output 100 (FIG. 8) are mounted on flange 90 for input and discharge of coolant. Suitable ducting 99 is provided for the input and discharge coolant flow between connectors 98, 100 and conduits 10 or 32, 34, 36 and 38 (FIGS. 1 and 2). Can 96 is slipped over board 50, board 50 being aligned and guided by rails 102, or other means until it mates with flange 90 whereupon it is hermetically sealed, e.g. welded, brazed etc. at the mating lips 104. Electrical connector 92 is shown as an edge connector but may be a pin connector etc. Coolant (dielectric) may flood package 106 to provide pressure equalization and provide secondary cooling if needed; the criteria being that coolant flow in conduits 10 or 32, 34, 36 and 38 (FIGS. 1 and 2) not be materially affected.

Figure 9:
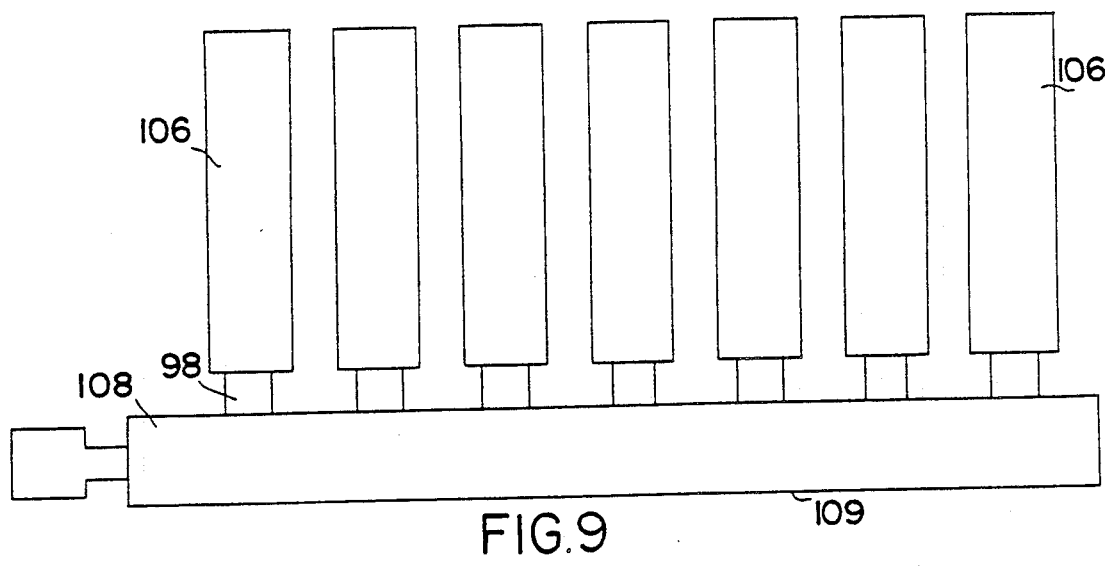
FIG. 9 is a side view of multiple enclosed conduit-board assemblies mounted on a common cooling conduit.
Figure 10:
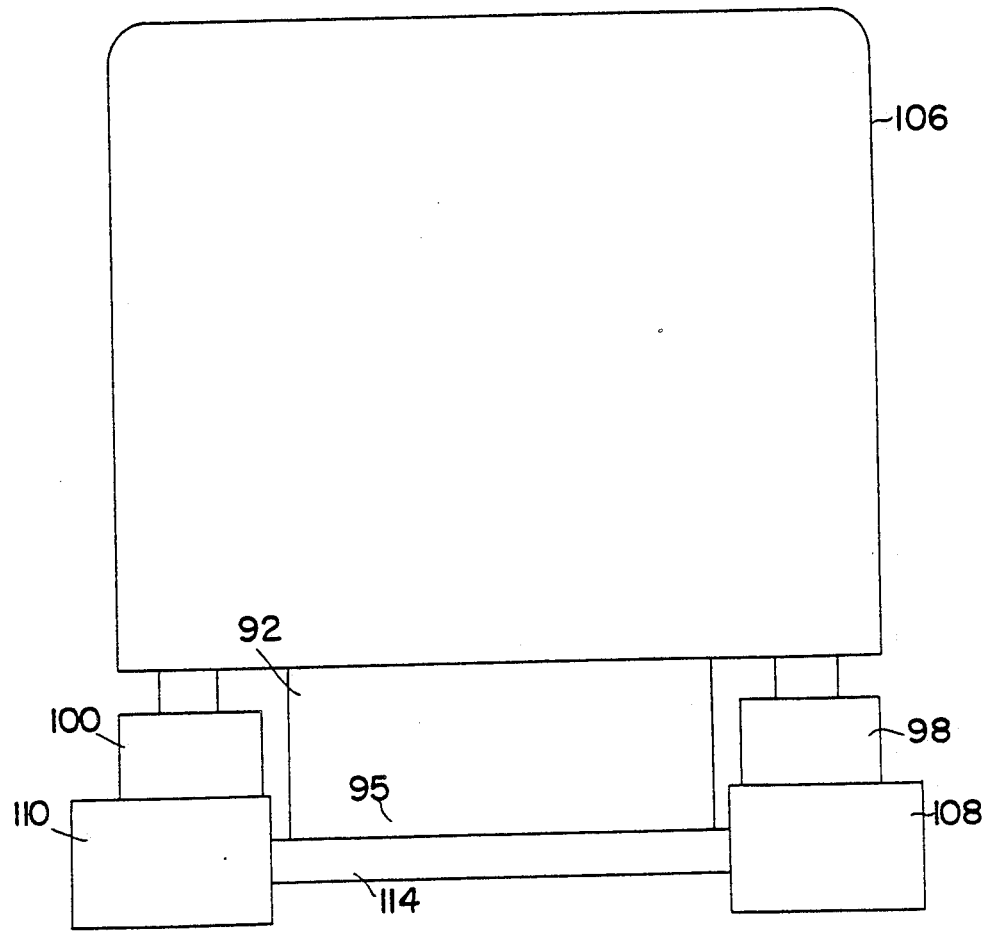
FIG. 10 is a front view of FIG. 9.

Multiple packages 106 comprising conduit assembly 73, interconnect substrate 50, mounted devices 53, connector 92, can 96, flange 90 and coolant connectors 98 and 100 may be mounted on a common coolant conduit assembly 109 containing input 108, output 110, coolant conduits and mother board 114 (FIG. 9 and 10). Connector 92 makes electrical connection with the mother board 114.

Figure 11:
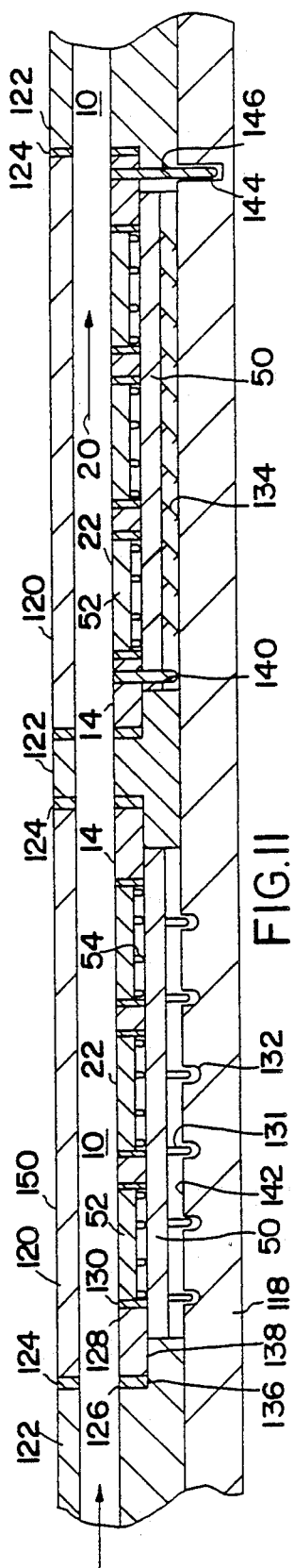
FIG. 11 is a cross section view in the direction of coolant flow of multiple multi-chip modules and associated coolant conduits mounted on a mother board.

Referring now the FIG. 11, shown is a further preferred embodiment of the present invention whereby multiple modules 50, each of said modules containing devices 53, shown as bare chips 52 for convenience, are mounted on a mother board 118. Devices 53 may be mounted and electrically connected to module 50 by flip chip, TAB, flip TAB or other means. Each module 50 has mounted thereon a coolant conduit (which functions as previously described) segment 120, i.e. a segment of conduit assembly 73, containing conduit 10 which provides for coolant flow over device heat exchange surface 22, as previously described. Heat exchange surface 22 may be on substrate 50 (FIGS. 3 and 6), or may be the exposed back surface of the chip itself if bare chip cooling is employed. Bare chip cooling offers the advantage of eliminating heat sink related thermal stresses.

As shown in FIG. 11, the mother board has mounted thereon a coolant conduit 122 which acts in cooperation with coolant conduit segment 120 mounted on module 50 such that conduit 10 of motherboard 118 coolant conduit 122 and the corresponding conduit 10 of module 50 coolant conduit 120 properly mate 124 with each other. The combination coolant conduit 122 and the several coolant conduits 120 comprise coolant conduit assembly 73. Said proper alignment and mating is defined such that any misalignment of conduits 10 in module 120 and mother board 122 does not, for example, cause excessive pressure drop nor does it create undesirable flow characteristics e.g., cavitation or vortex shedding, to a degree that might cause the critical heat flux to be exceeded with consequent burn-out of any device in the system. Thus, those misalignments, tilts etc. of conduit interfaces 124 due to manufacturing tolerances are acceptable as long as device performance and reliability is not compromised. To minimize coolant leakage at conduit mating surface 124, soft elastomer gasket 126 may be employed that compresses and seals upon installation of module 50 into mother board 118.

Coolant conduit 120, 122, i.e. coolant conduit assembly 73, may be molded or fabricated from a suitable material, for example, a rigid or semi-rigid plastic that is chemically and physically compatible with the dielectric coolant. The coolant conduit 120 is prepared as previously described with cut-outs in the lower surface corresponding to the geometry and placement of chips. The heat exchange surface 22 of chips 52 are approximately coincident with lower surface 14 of conduit 10 to provide for adequately smooth coolant flow without excessive cavitation, vortex shedding etc. To accommodate manufacturing tolerances, a thin elastomer 130 may be provided at the interface 128 of the side walls of chip 52 and coolant conduit 120. The degree of compression of elastomer 130 is small, e.g. ~0.1 mm and generally does not exceed 1 mm.

Figure 12:
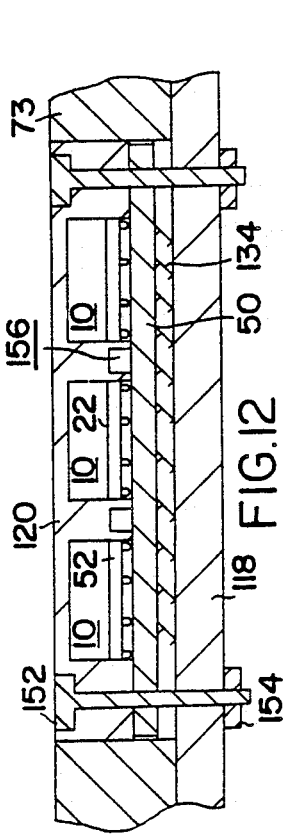
FIG. 12 is a cross section view of FIG. 11 orthogonal to the direction of coolant flow.

Electrical connections from module 50 to mother board 118 may be made by pins 131 into sockets 132. Alternately, pressure e.g., spring contacts 134 may be employed which minimize module 50 insertion and removal forces. To provide for alignment of conduits 10 in coolant conduits 120, 122 a shoulder 136 may be provided on coolant conduit 122 of such geometry that when engaged by the underside 138 of conduit 120 respective conduits 10 of coolant conduits 120, 122 are aligned. Surface 136 acts as a limit to the depth of insertion of module 50. A further method for positioning the height of module 50 for alignment of conduits 10 is to employ pin 140 which presses against surface 142 of mother board 118 to provide said conduit 10 alignment. To hold module 50 in position various means may be employed such as sockets 144 with snap rings may be mounted in mother board 118. Pins 146 on module 50 corresponding in position to sockets 144 in board 118 engaged by snap-rings or other means, contained therein. Pins 146 may act as dowl points to obtain precise alignment of module 50 with respect to board 118. As shown in FIG. 12, a further method to fasten module 50 to mother board comprises employing threaded bolts 152 which is molded into coolant conduit 120 and which passes through coolant conduit 120 and mother board 118, and is secured in place by nut 154. Conduits 156 may be provided in coolant conduit 120 for the routing of wires to make circuit changes after fabrication as well as for coolant pressure equalization within the enclosure 106.

Figure 13:
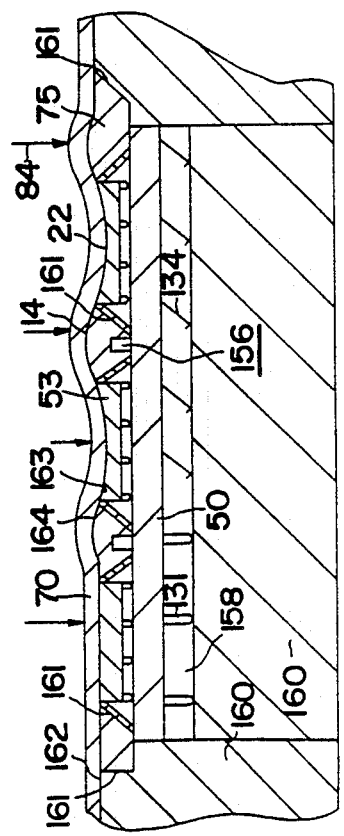
FIG. 13 is a cross section view illustrating the assembly steps of a multi-chip module containing linear flow and curved surface flow devices.

FIG. 13 illustrates an embodiment of the construction of module assembly 158 comprising module 50 with electrical interconnect means, e.g. pins 131, spring contacts 134 etc. to mother board, devices 53 which may be bare chip or packaged devices with heat sink member 60 as previously described.

Devices shown in FIG. 13 are both linear and curved surface. Linear bare chips are chips with no member 60 bonded to the surface 58 of chip 52. With curved surface bare chips, surface 58 may be made concave curved by various means; mechanically, e.g. grinding, chemically, e.g. etching etc. Pressure 84 may be provided by elastomer, hydraulic, pneumatic or other means.

FIG. 13 shows a column of devices 53 containing a combination of linear and curved heat exchange surfaces 22. Platen 70 in pressing against concave curved heat exchange surface 22 also becomes curved. Between curved surface devices 53 platen 70 is caused to provide a convex curvature 163 so as to provide smooth coolant flow conditions, i.e. minimal cavitation, vortices etc. Suitable surface geometries 164 are also provided when transitioning from linear to curved heat exchange surfaces 22 to obtain reasonably smooth flow characteristics.

Figure 14:
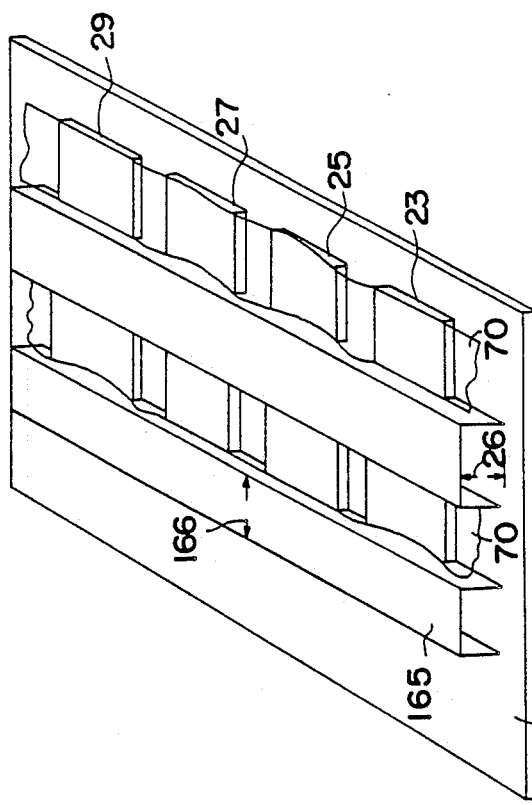
FIG. 14 is an angled view of FIG. 13.

Referring to FIG. 14, shown are columns of devices 53, e.g. 23, 25, 27 and 29, each with a fitted platen 70. This is employed because adjacent columns of devices may not have curved heat exchange surface 22 devices 53 in corresponding positions for platen 70 to conform to. The edges of adjacent platens 70 would butt against each other to minimize leakage of molding material, or with an elastomer pressure 84 source, leakage could be substantially eliminated. An alternative embodiment is to provide additional mold elements 165 to enable molding of conduit partitions 30 of desired height 26 and suitable width 166, said width generally not encroaching upon device heat exchange surface 22. Partitions 30 serve the function of those in of FIG. 2. An upper surface 12 of the conduit assembly may be separately molded and provided with both linear (FIG. 3) and curved (FIG. 5) surfaces corresponding with linear and curved heat exchange surfaces 22 of devices 53 thereby maintaining an approximately uniform conduit 10 cross section throughout conduit assembly 73.

Figure 17:
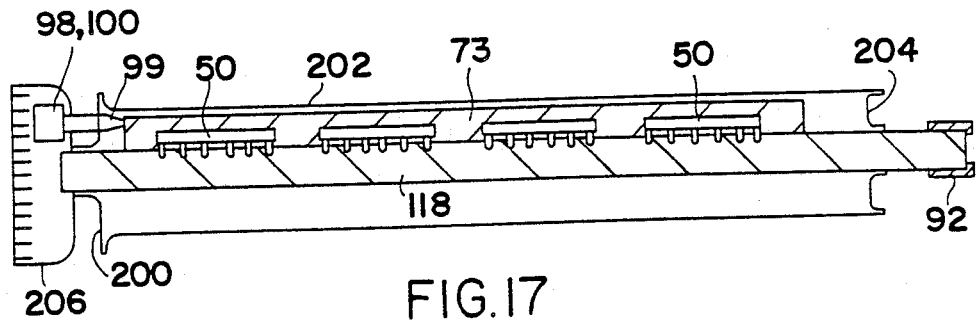
FIG. 17 is an outline cross section view of a sealed board assembly containing multiple modules and electrical connectors at both ends.

Referring now to FIG. 17, shown is a sealed liquid cooled mother board, containing multiple multi-chip modules, with electrical connectors at both ends comprising multi-chip modules 50 (with associated devices 53 and coolant conduit 120 [FIG. 11]) conduit assembly 73, mother board 118, front sealing flange 200, housing 202, rear sealing flange 204, front electrical connectors 206 which may be pin connectors for a back plane connector, coolant input 98 and discharge 100 connectors as described in FIG. 8, transition coolant conduit 99 from connectors 98, 100, to conduct assembly 73 and rear electrical connector 92 which may be an edge connector.

Dielectric coolants, when properly used, though not as efficient as water offer significant advantages including being non-conductive, non-corrosive, no algae growth and selectable boiling point. There are a number of fluorocarbons with desirable boiling points for use as a semi-conductor coolant, e.g. R114, (BP4° C.), R11 (BP24°0 C.), FC87 (BP32° C.), R113 (BP47° C.), and FC 72 (BP56° C.). Thus, for a given thermal resistance, fluorocarbon boiling point, and operating power (plus superheat) the device junction temperature can be specified; this temperature being substantially constant from board to board, cabinet to cabinet and room to room independent of location and environment. Should a junction temperature intermediate between that available from the pure coolants be desired, coolants can be mixed to obtain an intermediate boiling temperature. For example, if a 40° C. boiling point were desired, an approximately 50%:50% mix of FC87 (BP32° C.) and R113 (BP47° C.) would be made inasmuch as the intermediate boiling point is approximately proportional to the ratio of the two liquids. Advantages may be obtained in mixing three or more liquids. To minimize separation of the liquids, characteristics, such as density should be matched as closely as possible. However, with turbulent coolant flow and consequent continuous mixing action, problems such as separation of liquids is minimized as contrasted to pool boiling.

Figure 18:
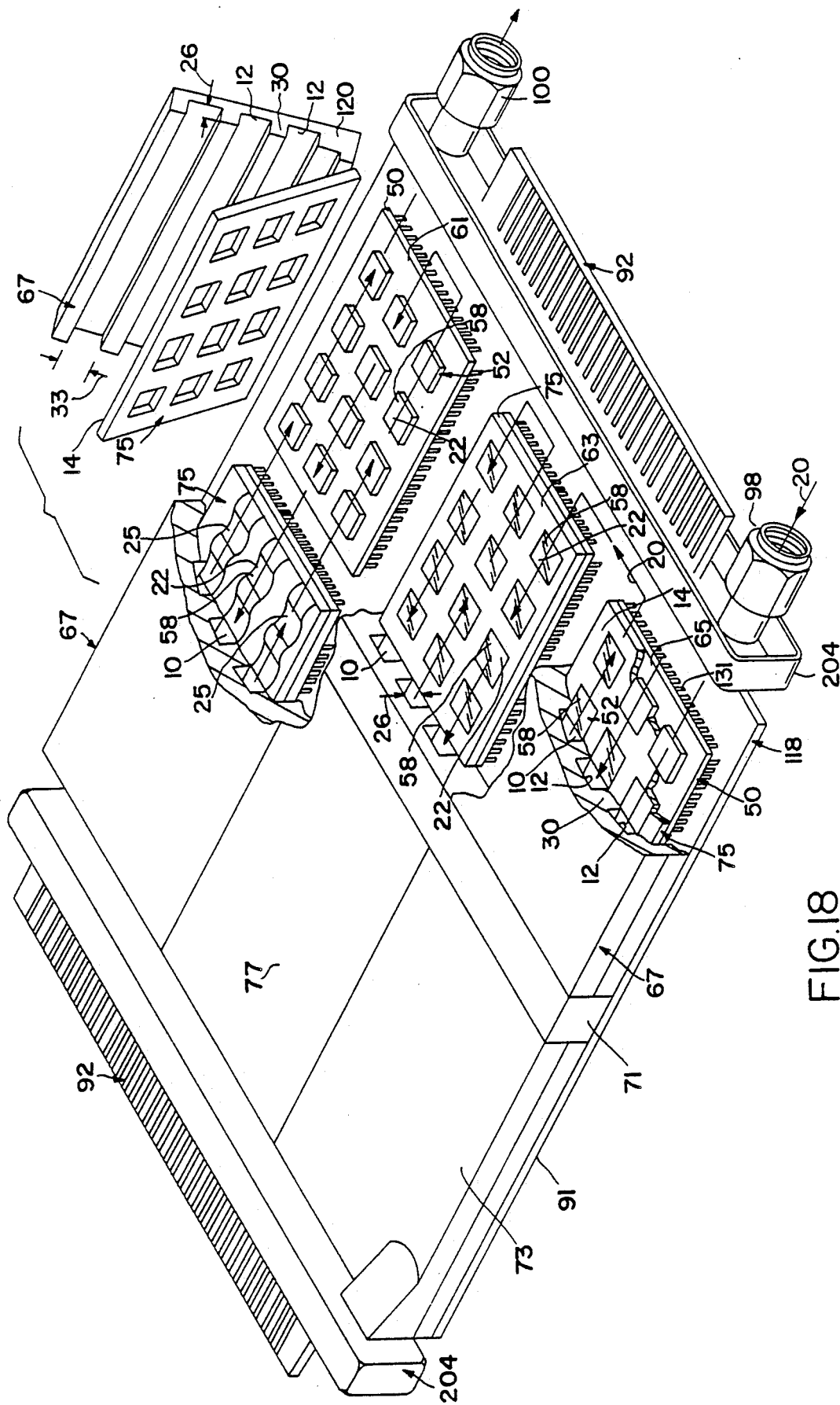
FIG. 18 is an angled partial cross section view of multi-chip modules mounted on a mother board with cut-away views of the various coolant conduit members.

Referring now to FIG. 18, shown is a preferred embodiment of the present invention comprising mother board 50 terminated in edge connectors 92 at both ends. Envelope flanges 204 are hermetically sealed to mother board 50. Input 98 and output 100 coolant connectors are mounted on flange 204. Multi-chip module 50 is electrically connected to and mechanically mounted on mother board 50 by interconnect pins 131. Devices are shown, for convenience, as bare chips 52 whose back surfaces 58 are directly cooled by coolant flow 20. Chips 52 heat exchange surfaces 22 are shown linear, i.e. flat, and are thus cooled by linear flow. Curved surface chips 25 may also be incorporated on the various multi-chip modules. Pre-molded lower conduit structure 75 containing lower conduit surface 14 is about to be "snapped" into position over chips 52 on multi-chip module assembly designated 61. Multi-chip module assembly designated 63 illustrates lower conduit structure 75 in place with the heat exchange surfaces 22 of chips 52 substantially co-planar with wetted conduit surface 14 of lower conduit structure 75. Substantially co-planar is herein defined as meaning that there are only minor discontinuities between chip surfaces 58 and conduit surface 14, i.e., generally less than 0.2 mm and seldom greater then 1 mm, and that dimensional variations caused by tilting or height variations between chips 52 on multi-chip modules 50 are smoothly bridged by surface 14 of lower conduit structure 75 such that undesirable flow characteristics such as eddies and vortex shedding are minimized and that a substantially hydraulically smooth conduit is provided. FIG. 4 illustrates the small departures from planar construction, i.e. substantially co-planar, as caused by manufacturing tolerances wherein chips 52 have small amounts of tilt or height variation as mounted on the multi-chip module. Upper coolant conduit structure 67 is a single molded or fabricated structure comprising partitions 30 of height 26 and width 33, upper conduit surface 12 and wall segment 120. Multi-chip module assembly designated 65 illustrates a cutaway of upper coolant conduit structure 67 positioned on the multi-chip module. Conduits 10 are formed by surfaces 12, 14, surfaces of partitions 30 and surfaces 58 of chips 52. Member 71 serves as the interconnect between the adjacent modules in the direction of coolant flow. Member 71 contains conduits 10 that are substantially identical to those of the multi-chip modules and that match up with corresponding conduits 10 in the various multi-chip modules designated 61, 63, 65, 73, 77 and 79 thereby providing smooth coolant flow, as shown in FIG. 11, through all the conduits. The conduits 10 are shown as hydraulically connected in series, but may be arranged in parallel or any combination of series-parallel depending on chip power dissipation, that is, optimum coolant velocity, flow rates and pressure drop may be selected. Multi-chip module designated 79 is illustrated with curved surface flow wherein the chips 25 are provided with concave curved heat exchange 22 surfaces 58. Lower conduit surface 14 and upper conduit surface 12 are curved correspondingly, in a smooth undulating manner so as to maintain a constant conduit height 26 and a substantially hydraulically smooth surface as shown in FIG. 6.

Figure 19:
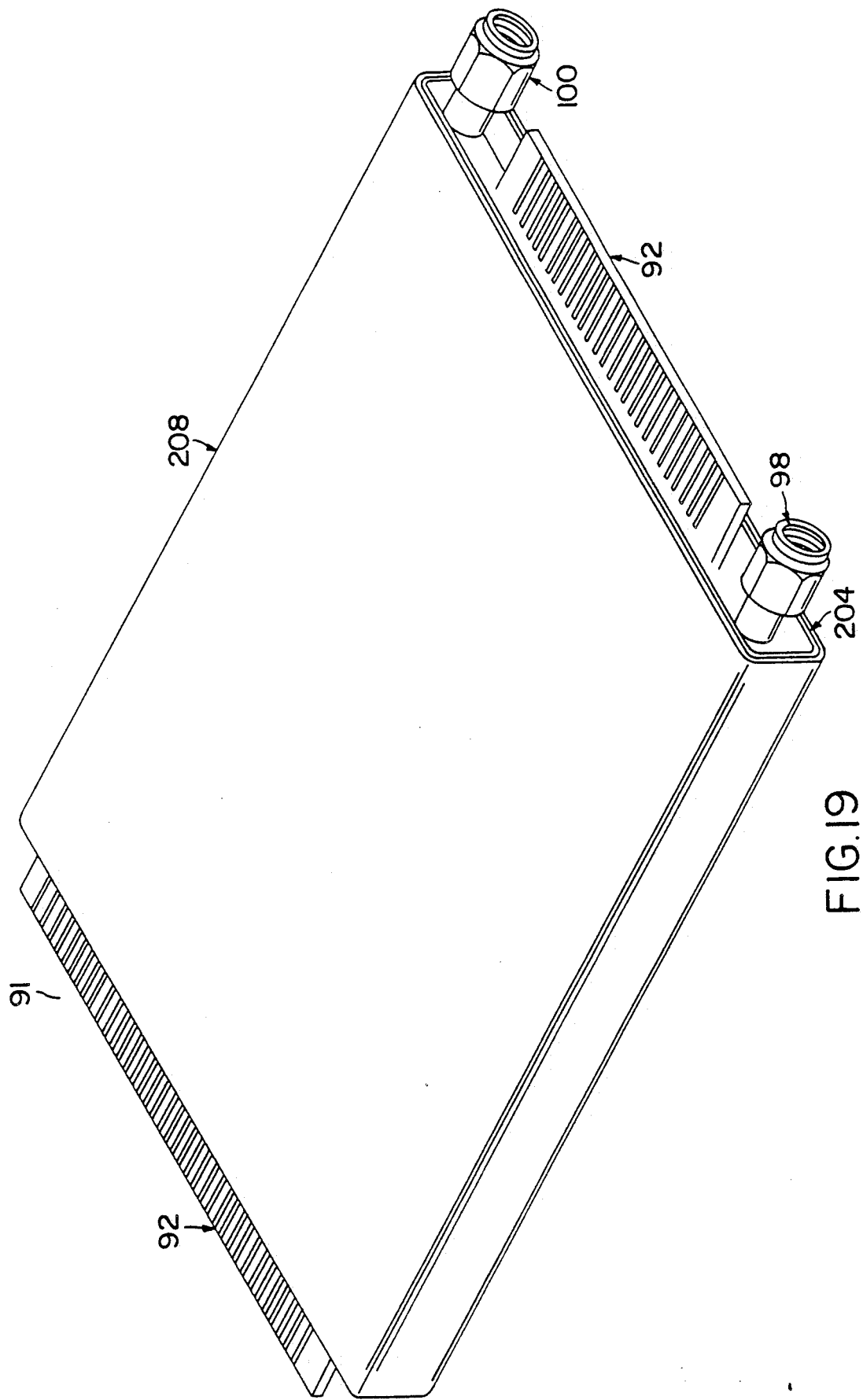
FIG. 19 is an angled view of a complete circuit board assembly with envelope enclosure.

Referring now to FIG. 19, shown is the multi-chip module assembly 91 enclosed by envelope 208. Envelope 208 is slipped over flanges 204 and hermetically sealed at the mating edges. If flange 204 and envelope 208 are metal, the mating edges may be joined by heliarc welding to effect a hermetic seal. For repairs, the heliarc joint may be ground away, envelope 208 removed and repairs welded. With proper flange 204 design, five or more dissassemblies for repair or modification are possible. The foregoing construction provides a rugged, compact and hermetically sealed structure. Envelope 208 and flange 204 may be made of other materials such as plastics where joining is affected by adhesives, or a combination of materials may be employed such as plastics and metal.

Figure 20:
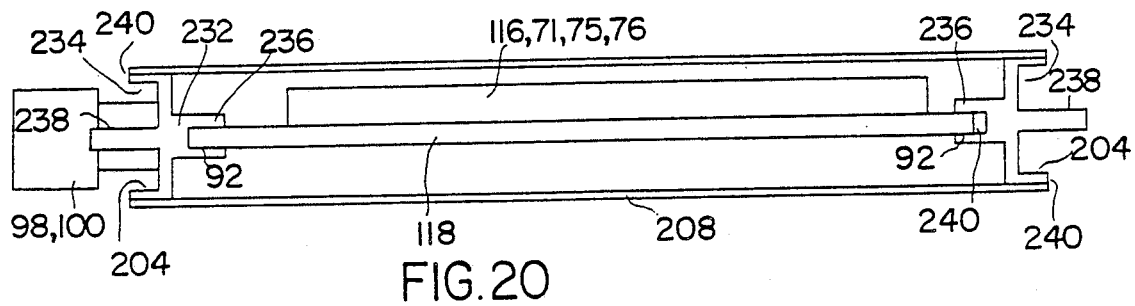
FIG. 20 is a cross section view of a circuit board assembly and housing provided with separate hermetic end connectors.

A further preferred embodiment is shown in FIG. 20 where hermetic feed through electrical connectors, such as might be required for military use, are incorporated. Mother board 118 with multi-chip modules 116 and the various coolant conduit members, 71, 75, 76, mounted thereon, etc. as shown in FIG. 18 is mounted on or plugged into hermetic connector 232 shown as an edge connector, but may be a pin connector etc. Hermetic electrical connector 232 flange 204 assembly 234 may be made of brazed metal-ceramic, or glass metal, high temperature plastic-metal or other suitable construction. Edge connector 92 of mother board 118 is inserted into the female segment 236 of connector 234 at the coolant connector 98, 100 end and may be locked in place. The mother board 118 assembly and connector 234 is slid, on rails or other means (not shown), into envelope 208 mate. Upon completion of insertion of the mother board 118 into envelope 208, the edge connector 92 at the end opposing the coolant connectors has been inserted into the corresponding female connector of opposing connector 234. Gap 240 between the end of male connector 92 and female connector 236 is provided to compensate for expansion. Where the lips of flanges 204 and envelope 208 meet 240, as in FIG. 19, a suitable liquid tight seal or hermetic, e.g. heliarc, braze, adhesive etc. is made.

Figure 21:
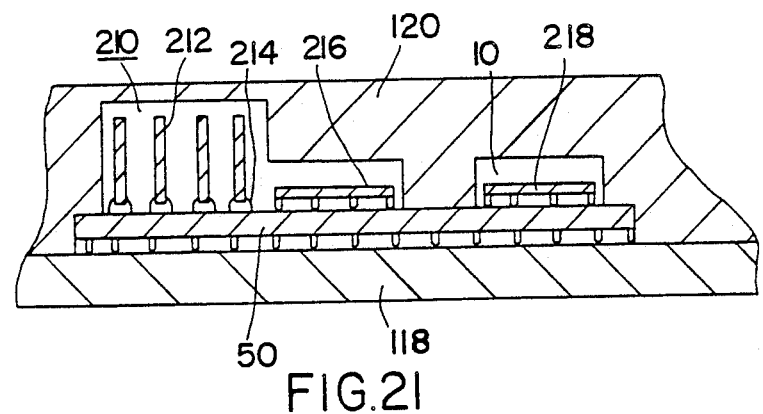
FIG. 21 is a partial cross section view of a multi-chip module with both low power and high power devices mounted thereon.

Referring now to FIG. 21, shown is multi-ship module 50 mounted on mother board 118. To provide for an integrated subsystem mounted on a single multi-chip module, a variety of semi-conductor chips may be required. For example, a self contained computing module for high speed video display or calculations might incorporate ECL gate arrays, RAM's, CPU's and glue chips Of the foregoing, the ECL gate arrays are generally high power dissipation, e.g. 60 W/cm$^2$ for the Motorola MCA-4 50,000 gate, 200 ps chip. For low power devices such as DRAMS, high coolant velocities are not required.

Compact packaging and efficient cooling of low power devices is shown in FIG. 21 Low pin count and low power devices such as DRAMS 212 may be mounted on edge with the electrical interconnects 214 also disposed on the edges. This allows for very dense packaging of the large number of DRAM's required. Low power CPU's and certain glue chips 216 with high pin counts would be mounted horizontally. Conduit 210 is shown as containing the low power DRAM's, CPU's and glue chips. Since the power per device is low in conduit 210, low coolant velocities are adequate. For a given coolant volumetric flow rate the coolant velocity is inversely proportional to the conduit cross section. Thus, the large conduit cross section 210 required to accommodate compact packing of low power chips 212 and 216, which may also be bare chips, can be tailored to obtain the desired coolant velocity. Lower coolant velocities result in lower pressure drops, a desirable characteristic. Conduit 10 containing high power chips 218 such as ECL gate arrays require high coolant velocities and are constructed as previously described for FIGS. 2, 3, 6, 11, 12 and 18. Conduits 210 and 10 may be connected in series or parallel, or conduits 210 of adjacent multi-chip modules may be connected in series, and conduits 10 of adjacent multi-chip modules may be connected in series. Any appropriate combination of series-parallel connection of the conduits may be made to meet heat removal and pressure drop requirements.

This construction provides for maximum packing density of chips with consequent minimum signal delays as provided by the short multi-chip module signal paths. The multi-chip module can now be a stand alone module, for example, for video or high speed numerical processing and may contain 40 each of 4M bit chips, 5 each of 50K gate ECL gate arrays and appropriate CPU and glue chips all on a module about 4 inches square for a total power dissipation of about 500 watts. Four of these modules on about a 10 square inch mother board would provide super computer performance in the multi-hundred mega-flop range. Employing a compact liquid-to-air heat exchanger would enable the system to be a desk-side package of about 2 ft.×2 ft. by 10 inches which could plug into a work station thereby enhancing performance tenfold at modest cost.

Figure 22:
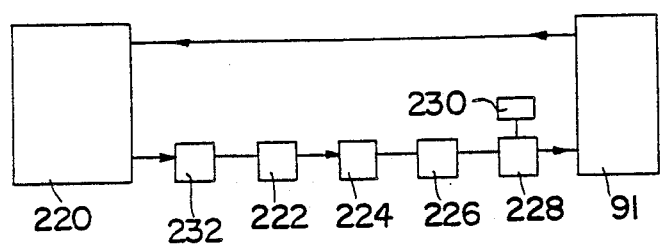
FIG. 22 is a schematic of a complete cooling loop for cooling circuit board assemblies described herein.

Referring now to FIG. 22, shown is a closed loop liquid-air heat exchanger system that might incorporate a single mother board FIG. 20 or a coolant manifold FIG. 9 with multiple mother boards. Liquid-to-air or liquid-to-liquid heat exchanger 220 discharges cooled coolant though sealed, e.g. magnetically coupled pump 232 and thence to filter 222 which removes particulates, acids and water as may be present during assembly or evolved in small quantities during system operation. Coolant then flows through pressure 224, temperature 226 and flow 228 sensors, if required, and then through bellows 230 or other elastic means which provides for coolant expansion and serves as a reservoir to replace lost coolant. The coolant then flows through the assembly of multi-chip modules 91 to remove heat from the chips and thence returns to the heat exchanger 220.

Through the foregoing description is addressed to multiple multi-chip modules mounted on a mother board, it may also be applied to a single board assembly wherein all the chips are mounted on a single board. Construction of conduits 10 and other elements, e.g. connector 92, coolant connectors 98, 100, housing 208 etc. remains substantially the same. The major difference being the elimination of the multi-chip modules and associated electrical interconnects, 50 are semi-conductor devices, 73 the coolant conduit assembly, 200 and 204 the flanges, 202 the housing, 98 and 100 the coolant connectors, and 92 and 206 the board electrical connectors.

A problem encountered with heat exchange surfaces incorporating dielectric coolants in boiling heat transfer is that of temperature overshoot in that after several on-off power cycles, the nucleating cavities on the heat exchange surface are flooded with coolant, the non-condensable gases normally present in said cavities having been substantially displaced by the low surface tension, low contact angle dielectric liquids. Nucleate boiling heat exchange surfaces using fluorocarbon liquids are especially prone to temperature overshoot. Upon establishment of steady nucleate boiling, the $\Delta T$ superheat returns to its normal value.

Means whereby the temperature overshoot may be reduced include reducing the initiating superheat. This may be accomplished by locally reducing the pressure directly over the reentrant nucleating cavity which in turn initiates nucleate boiling at a lower superheat. This pressure reduction may be obtained by causing the coolant streamlines to follow a curved path directly over the cavity thus taking advantage of the Bernoulli effect. Curved coolant streamlines may be induced by protrusions which are preferably part of the cavity geometry. We refer to these as effects as microcurvature effects to distinguish them from the macrocurvature of the curved heat transfer surfaces shown in FIGS. 6, 13 and 14.

In general, the height of the protrusions ranges from about 0.1 the height of the viscous sublayer to past the transition zone into the main flow region.

Figure 15:
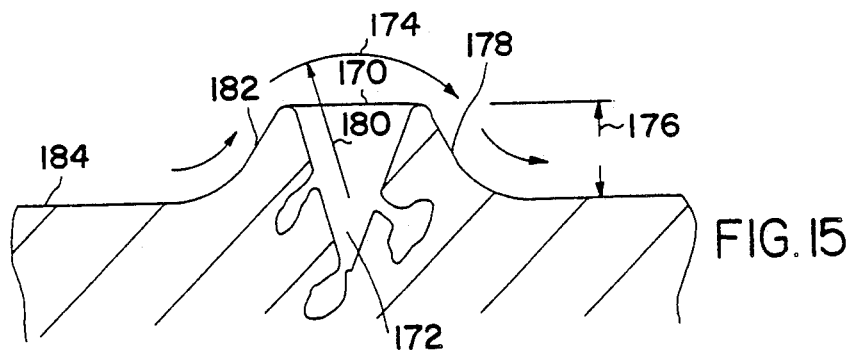
FIG. 15 is a cross section view of a nucleating site cavity that is designed to minimize temperature overshoot.

In general, it is desirable to encompass cavity 172 with protrusion 178, the throat 170 of cavity 172 being exposed to coolant flow as shown in FIG. 15. The outer surface of protrusion 178 is shown as approximately concave 182 so as to promote curved streamlines 174. The distribution of reentrant nucleating site cavities 172 and protrusions 178 on heat exchange surface 152 is such so as to obtain optimum heat transfer rates. Cavity dimensions may range from 0.002 mm to 0.2 mm and cavity-to-cavity spacing may range from 0.03 mm to 3 mm. Other geometries of protrusion 178 may prove optimum depending on coolant parameters such as velocity, density, viscosity, surface tension, temperature etc.

Figure 16:
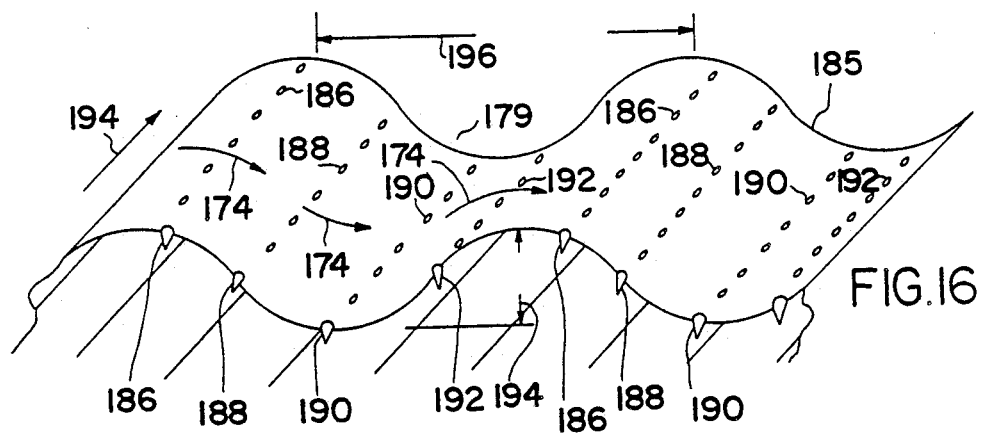
FIG. 16 is an angled view of an undulating surface of small dimensions containing nucleating site cavities designed to minimize temperature overshoot.

A further preferred embodiment to reduce the initiating superheat is shown in FIG. 16. Heat transfer surface 179, for both curved and linear surfaces, is caused to undulate 185 in the direction of coolant flow 174 with the undulations projecting linearly in the direction 194 orthogonal to coolant flow 174, that is, undulations 185 are elongated in direction 194. For discussions purposes, cavity 186 is shown at the peak of the undulation, cavity 188 on the downstream slope, cavity 190 in the trough and cavity 192 on the upstream slope. In general, cavity distribution will be denser than described above. Coolant streamlines 174 are shown concave over the line of cavities 186 along the peak of undulations 189 thus lowering the pressure by the Bernoulli effect and triggering nucleate boiling. Cavities 188 on the downstream side of undulation 185 will experience a lower local pressure drop than cavities 186. Cavities 190 in the trough of undulation 185 will see a small pressure increase while cavities 192 in the upstream surface will see a pressures increase.

Nucleate boiling will commence with cavities 186 which have the lowest pressure over the cavities. The localized intense turbulence generated by the nucleate bubbles combined with the sweep of nucleate bubbles over cavities 188 will trigger nucleate boiling in cavities 188. In like manner nucleate boiling will be triggered successively in cavities 190 and then 192. Once nucleate boiling commences with cavities 186, streamlines 174 tend to be broken up and local turbulence at the nucleating sites increasingly predominates. Under these conditions the curved streamlines 174 illustrated in FIGS. 15 and 16 are completely disrupted and the microcurvature effects no longer influence the heat transfer process. Heights 194, that is, peak-to-peak, of the undulating surface 185 may range from 0.001 mm to 0.5 mm and the period 196 of undulations 185 may range from 0.005 mm to 5 mm.

Cavities 172 and related protrusions 178 may be made by a number of methods. For minute cavities and protrusions of micron and sub-micron dimensions with high packing densities Electrical Discharge Texturing (EDT), a variant of Electrical Discharge Machining (EDM), may be used. Other methods such as chemical milling or laser drilling may be used for larger cavities and protrusions. Reactive chemicals may be added to the above processes to promote desired protrusion and reentrant cavity geometries during surface preparation.

At the throat 170 of cavity 172 in FIG. 13, the pressure in the liquid is lowered by an amount:

$$\Delta P \sim p\, v^2\, h/r$$

where p is the liquid density, v is the coolant velocity 174, h the height 176 of the protrusion 178 and r the radius of microcurvature 180 of the coolant steamlines 174 passing over cavity 172. The streamlines 174 are shown as concave curved with respect to cavities 172. The geometry of the protrusions 178 are made such as to optimize the radius of curvature 180 of the streamlines 174. If the radius of curvature of the streamlines is too small as might occur with a sharp protrusion, the streamlines could break up, vortex shedding could take place etc., thus rendering the protrusions less effective. Water at a velocity of 15 meters/sec. has a viscous sublayer thickness of about $5 \times 10^{-3}$ mm and a transition zone thickness of about $25 \times 10^{-3}$ mm. Heights of the protrusions above the heat exchange surface 184 may range from about one tenth of the thickness of the viscous sublayer to about three times the combined thickness of the viscous sublayer and transition zone, i.e., 0.001 mm to 0.5 mm. Thus, temperature overshoot can be reduced by this cavity enhancement method.

I claim:

1. A liquid cooled multi-chip semi-conductor module comprising multiple bare semi-conductor devices each having one surface prepared with electrical interconnect means for mechanical and electrical attachment to an electrical interconnect substrate, said bare semi-conductor devices having a surface opposing said electrical interconnect surface, said opposing surface being a heat transfer surface, whereby heat generated in said bare semi-conductor devices may be readily transported to said opposing heat transfer surface and there said heat is removed by a liquid coolant, there further being a conduit for the directing of the flow of said coolant, a first surface of said conduit having apertures corresponding in placement and geometry to said heat transfer surfaces of said semi-conductor devices wherein said heat transfer surfaces and said conduit surface containing said apertures are substantially coincident thereby providing a substantially hydraulically smooth surface for the flow of coolant, and there being a second and opposing conduit surface spaced uniformly apart from said first conduit surface and having walls at the extremes of said conduit surfaces thereby defining said conduit, said multi-chip semi-conductor modules being mounted on a mother board contained within a liquid tight enclosure provided with coolant input and discharge connectors hydraulically coupled to said coolant conduits and said coolant fills void in and around said multi-chip modules and mother board in said enclosure, said enclosure further being provided with electrical interconnect means.

2. The apparatus of claim 1 wherein said semi-conductor heat exchange surface has bonded in intimate thermal contact thereto a low thermal resistance member of approximately the same surface area and geometry as said semi-conductor heat exchange surface whereby mechanical support and protection is provided to said semi-conductor, said second member having its heat transfer surface opposing said semi-conductor approximately coincident with said conduit surface containing said apertures.

3. The apparatus of claim 2 wherein said second low thermal resistance member is a metal ranging in thickness between 0.05 mm and 3 mm.

4. The apparatus of claim 3 wherein said metal is at least one from the group of molybdenum, tungsten and alloy 42 and like alloys.

5. The apparatus of claim 2 wherein second low thermal resistance member is a dielectric ranging in thickness between 0.05 mm and 5 mm.

6. The apparatus of claim 5 wherein said dielectric is at least one from the group of Silicon Carbide, Aluminum Nitride, Silicon Nitride, Aluminas and Beryllia.

7. The apparatus of claim 6 wherein said dielectric is at least one from the group of Silicon Carbide, Aluminum Nitride, Silicon Nitride, Alumina and Beryllia.

8. The apparatus of claim 1 wherein partitions are placed in the direction of coolant flow, between columns of said semi-conductor devices, said partitions extending the height of said conduit thereby providing separate conduits and effectively sealing adjacent columns of semi-conductor devices from its neighbors.

9. The apparatus of claim 8 wherein said separate conduits are connected in at least one of series or a combination of series-parallel for the flow of coolant.

10. The apparatus of claim 8 wherein at least two columns of low power devices are included in one conduit.

11. The apparatus of claim 1 wherein said heat exchange surface is provided with elevated reentrant nucleating site cavities, said elevated cavities having a height ranging from 0.001 mm to 0.5 mm above said heat exchange surface and the dimensions of said cavities ranging from 0.002 mm to 0.2 mm and said cavities being spaced apart on said heat exchange surface from 0.03 mm to 3 mm.

12. The apparatus of claim 11 wherein said heat exchange surface is caused to undulate in the direction of coolant flow, said undulations ranging from a peak-to-peak height above the heat exchange surface from 0.001 mm to 0.5 mm and the periods of said undulations ranging from 0.005 mm to 5 mm.

13. The apparatus of claim 1 wherein chips with curved heat exchange surfaces are mounted on modules with linear heat exchanger surface chips, said conduit cross section in the direction of coolant flow being maintained with a substantially constant cross section.

14. A liquid cooled multi-chip semi-conductor module comprising multiple bare semi-conductor devices each having one surface prepared with electrical interconnect means for mechanical and electrical attachment to an electrical interconnect substrate, said bare semi-conductor devices having a surface opposing said electrical interconnect surface, said opposing surface being a heat transfer surface, whereby heat generated in said bare semi-conductor devices may be readily transported to said opposing heat transfer surface and there said heat is removed by a liquid coolant, said heat transfer surface being concave curved in the direction of coolant flow, there further being a conduit for the directing of the flow of said coolant, the first surface of said conduit having apertures corresponding in placement and geometry to said heat transfer surfaces of said semi-conductor devices the conduit surface between adjacent concave curved heat exchange surfaces in the direction of coolant flow being convexly curved, said concave and said convex surfaces being joined in a substantially smooth manner thereby forming an undulating surface, and the opposing second surface of said conduit having a like undulating geometry thereby being uniformly spaced from said first surface and forming a conduit of substantially constant cross-section, and having walls at the extremes of said conduit surfaces thereby defining said conduit, said multi-chip semi-conductor modules being mounted on a mother board contained within a liquid tight enclosure provided with coolant input and discharge connectors hydraulically coupled to said coolant conduits and said coolant fills voids in and around said multi-chip modules and mother board in said enclosure, said enclosure further being provided with electrical interconnect means.

15. The apparatus of claim 14 wherein said semi-conductor heat exchange surface has bonded in intimate thermal contact thereto a low thermal resistance member of approximately the same surface area and geometry as said semi-conductor heat exchange surface whereby mechanical support and protection is provided to said semi-conductor, said second member having its heat transfer surface opposing said semi-conductor approximately coincident with said conduit surface contacting said apertures.

16. The apparatus of claim 15 wherein said second low thermal resistance member is a metal ranging in thickness between 0.05 mm and 3 mm.

17. The apparatus of claim 16 wherein said metal is at least one from the group of molybdenum, tungsten and alloy 42 and like alloys.

18. The apparatus of claim 15 wherein second low thermal resistance member is a dielectric ranging in thickness between 0.05 mm and 5 mm.

19. The apparatus of claim 14 wherein partitions are placed in the direction of coolant flow, between columns of said semi-conductor devices, said partitions extending the height of said conduit thereby providing separate conduits and effectively sealing adjacent columns of semi-conductor devices from its neighbors.

20. The apparatus of claim 19 wherein said separate conduits are connected in at least one of series or a combination of series-parallel for the flow of coolant.

21. The apparatus of claim 19 wherein at least two columns of low power devices are included in one conduit.

22. The apparatus of claim 14 wherein said heat exchange surface is provided with elevated reentrant nucleating site cavities, said elevated having a height ranging from 0.001 mm to 0.5 mm above said heat exchange surface and the dimensions of said cavities ranging from 0.002 mm to 0.2 mm and said cavities being spaced apart on said heat exchange surface from 0.03 mm to 3 mm.

23. The apparatus of claim 22 wherein said heat exchange surface is caused to undulate in the direction of coolant flow, said undulations ranging from a peak-to-peak height above the heat exchange surface from 0.001 mm to 0.5 mm and the periods of said undulations ranging from 0.005 mm to 5 mm.

24. A multi-chip cooling module, comprising:
   a housing having a fluid inlet port and a fluid discharge port for circulating fluid through said housing;
   a circuit board mounted within said housing and having a first, essentially substantially flat surface defining a first plane;
   a plurality of electronic devices mounted to said first surface, each of said electronic devices having a heat transfer surface spaced apart from said first surface;
   a template having a plurality of openings configured to receive said electronic devices therewithin, respectively, said template further including a second, upper surface forming, in conjunction with said plurality of heat transfer surfaces, a substantially continuous surface;
   a cover having a third surface spaced apart from said substantially continuous surface, such that said third surface and said substantially continuous surface define a conduit through which said fluid is directed in a direction generally parallel to said first surface.

25. The module of claim 24, wherein the width of said conduit is between 1.0 and 1.3 centimeters.

26. The module of claim 24, wherein said substantially continuous surface comprises a hydraulically smooth surface, and said conduit exhibits an essentially constant cross section along the length thereof.

27. The module of claim 24, wherein said substantially continuous surface is generally planar.

28. The module of claim 24, wherein the distance between said substantially continuous surface and said second surface ranges from approximately ⅛ to 5 millimeters.

29. The module of claim 24, wherein at least one of said electronic devices comprises a bare chip having a low thermal resistance member intimately bonded thereto, and said heat transfer surface comprises an exposed surface of said low thermal resistance member.

30. The module of claim 24, wherein said heat exchange surfaces are concave curved with respect to said conduit.

* * * * *